(12) United States Patent
Diffenderfer et al.

(10) Patent No.: US 9,086,711 B2
(45) Date of Patent: Jul. 21, 2015

(54) SINGLE-ENDED HIGH VOLTAGE INPUT-CAPABLE COMPARATOR CIRCUIT

(71) Applicant: QUALCOMM Incorporated, San Diego, CA (US)

(72) Inventors: Jan Diffenderfer, Escondido, CA (US); Yu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 183 days.

(21) Appl. No.: 13/740,539

(22) Filed: Jan. 14, 2013

(65) Prior Publication Data

US 2014/0199948 A1 Jul. 17, 2014

(51) Int. Cl.
*H04B 1/28* (2006.01)
*G05F 1/46* (2006.01)
*H03K 3/3565* (2006.01)
*H03K 19/0185* (2006.01)

(52) U.S. Cl.
CPC ............. *G05F 1/46* (2013.01); *H03K 3/3565* (2013.01); *H03K 19/018521* (2013.01)

(58) Field of Classification Search
CPC .......... H04B 1/405; H04B 1/406; H04B 1/40; H04B 1/005; H04B 1/28; H04B 1/30; H04M 1/0262; H04M 19/08; H03D 7/125; H03D 7/1433; H03D 7/1441
USPC ............ 455/75, 76, 77, 550.1, 572, 313, 323, 455/333, 334, 343
See application file for complete search history.

(56) References Cited

U.S. PATENT DOCUMENTS

| | | | | |
|---|---|---|---|---|
| 5,057,712 A * | 10/1991 | Trinh et al. | | 326/86 |
| 5,378,945 A | 1/1995 | Partovi et al. | | |
| 5,952,848 A * | 9/1999 | Morris | | 326/81 |
| 6,784,717 B1 | 8/2004 | Hunt et al. | | |
| 7,276,953 B1 | 10/2007 | Peng et al. | | |
| 7,528,634 B2 | 5/2009 | Can | | |
| 7,821,327 B2 | 10/2010 | Parameswaran et al. | | |
| 7,969,190 B2 * | 6/2011 | Chuang et al. | | 326/81 |
| 2005/0110520 A1 | 5/2005 | Chuang et al. | | |
| 2010/0033214 A1 | 2/2010 | Deshpande et al. | | |

FOREIGN PATENT DOCUMENTS

| | | |
|---|---|---|
| DE | 19719448 A1 | 11/1998 |
| EP | 0595318 A2 | 5/1994 |
| EP | 0720294 A1 | 7/1996 |

OTHER PUBLICATIONS

International Search Report and Written Opinion—PCT/US2014/011046—ISA/EPO—Apr. 10, 2014.

* cited by examiner

*Primary Examiner* — Nhan Le
(74) *Attorney, Agent, or Firm* — Linda G. Gunderson

(57) ABSTRACT

A single-ended comparator is disclosed herein. The comparator may be implemented with low-voltage semiconductor devices that are capable of operating with high-voltage signals at an input. The single-ended comparator may be integrated in a larger circuit to receive and detect information provided on the input at voltage levels higher than the levels supported by the rest of the circuit, and transfer the information in the received signal for use by the rest of the circuit.

21 Claims, 5 Drawing Sheets

SINGLE-ENDED HIGH VOLTAGE INPUT-CAPABLE COMPARATOR CIRCUIT

BACKGROUND

1. Field

Aspects of the present disclosure relate generally to a comparator circuit. More particularly, this disclosure includes a low power, single-ended comparator circuit capable of receiving high-voltage input signals, where the circuit is implemented using low-voltage semiconductor devices.

2. Background

With the evolution of MOS semiconductor technology, transistor feature size is becoming smaller in order to increase circuit operating frequency and improve power efficiency. On the other hand, decreasing transistor dimensions requires decreasing power supply voltage and CMOS gate-oxide thickness so that constant electrical field scaling can be realized. Thus, as MOS semiconductor technology has evolved, the maximum tolerable voltage across transistor gate oxide in newer semiconductor devices has become smaller. However, some communication protocols still require electrical signal levels that are higher than those that these transistors are capable of supporting. For example, in standards such as the Universal Serial Bus (USB) standard as promulgated by the USB Working Group, single-ended data signals have a voltage swing of 0-3.3V. However, 3.3V-tolerable transistors are not available in many present advanced deep sub-micron CMOS processes. Although a conventional over-voltage protection transistor may be used to create a circuit that may handle the required voltage swing by reducing the level of the input signal, the voltage level at the upper end of the signal as reduced by the conventional over-voltage protection transistor may not be large enough to reach a required switching threshold of a subsequent circuit. Thus, it is becoming more difficult to integrate circuits that support these higher voltage communication protocols into newer semiconductor devices. Consequently, multiple semiconductor devices must be fabricated, which drives up costs and complexity.

A circuit capable of handling high-voltage signals using only low-voltage transistors is desirable to allow integration of circuits that are specification compliant with communication protocols requiring high-voltage signals into the same die as other circuits not having these requirements.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide a single-ended comparator implemented with low-voltage semiconductor devices that is capable of operating with high-voltage signals at an input. The single-ended comparator circuit may be integrated in a larger circuit to receive and detect information provided on the input at voltage levels higher than the levels supported by the rest of the circuit, and transfer the information in the received signal for use by the rest of the circuit.

In one aspect, the disclosure provides an apparatus having an input node configured to receive an input voltages within a signal having an input voltage range, the input voltage range having a first range and a second range; a voltage-limited output node; a first semiconductor device configured to couple the input node and the voltage-limited output node when an input voltage at the input node is within the first range of the input voltage range; and a second semiconductor device configured to couple the voltage-limited output node to a power supply voltage source having a power supply voltage level when the input voltage at the input node is within the second range of the input voltage range, wherein the input voltage range is greater than an operating range of either the first or second semiconductor device, and wherein the input voltage range is greater than the power supply voltage level.

In another aspect, the disclosure provides an apparatus having an input node configured to receive input voltages within an input voltage range, the input voltage range having a first range and a second range; a voltage-limited output node; a first semiconductor means configured to couple the input node and the voltage-limited output node when an input voltage at the input node is within the first range of the input voltage range; and a second semiconductor means configured to couple the voltage-limited output node to a power supply voltage source having a power supply voltage level when the input voltage at the input node is within the second range of the input voltage range, wherein the input voltage range is greater than an operating range of either the first or second semiconductor means, and wherein the input voltage range is greater than the power supply voltage level.

In yet another aspect, the disclosure provides a method for coupling information received at an input node and an output node, having receiving input voltages within an input voltage range, the input voltage range having a first range and a second range; coupling the input node and the output node through a first semiconductor device when the input voltage at the input node is within the first range of the input voltage range; and coupling the output node to a power supply voltage source through a second semiconductor device when the input voltage at the input node is within the second range of the input voltage range, wherein the power supply voltage source having a power supply voltage level; wherein the input voltage range is greater than an operating range of either the first or second semiconductor device, and wherein the input voltage range is greater than the power supply voltage level.

In yet another aspect, the disclosure provides an apparatus for wireless communication, having at least one processor; and an input circuit coupled to the at least one processor. The at least one processor has an input node configured to receive input voltages conveying information to be used by the at least one processor, wherein the input voltages is within an input voltage range and the input voltage range having a first range and a second range; a voltage-limited output node; a first semiconductor device configured to couple the input node and the voltage-limited output node when an input voltage at the input node is within the first range of the input voltage range; and a second semiconductor device configured to couple the voltage-limited output node to a power supply voltage source having a power supply voltage level when the input voltage at the input node is within the second range of the input voltage range, wherein the input voltage range is greater than an operating range of either the first or second semiconductor means, and wherein the input voltage range is greater than the power supply voltage level.

These and other aspects of the invention will become more fully understood upon a review of the detailed description, which follows.

BRIEF DESCRIPTION OF THE DRAWINGS

These and other sample aspects of the disclosure will be described in the detailed description that follow, and in the accompanying drawings.

Figure 1:
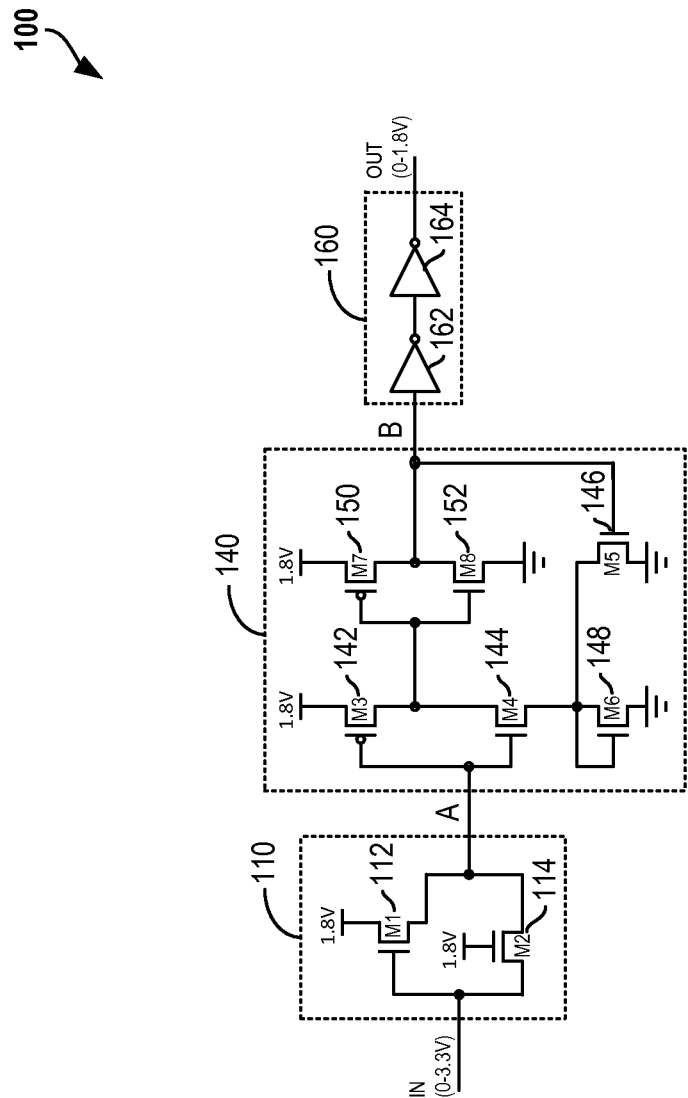
FIG. 1 is a circuit diagram of a single-ended comparator circuit configured in accordance with one aspect of the disclosed approach.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Various aspects of using low-voltage semiconductor devices to implement a low power, single-ended comparator that is compatible with high-voltage input signals are described herein. As referred to herein, a "high-voltage" may be understood to refer to a voltage level sufficient to cause a low-voltage semiconductor device to suffer gate-oxide breakdown, where gate-oxide breakdown is defined to be when a cluster of connected bonds extends from one interface of the gate-oxide to an opposite interface. The various aspects may be embodied in a comparator circuit implemented by using low-voltage devices capable of handling high-voltage input signals on an order of 3.3V, with low-to-high and high-to-low switching threshold voltages within approximately 0.8V to 2.0V, and a typical hysteresis voltage of 0.2V, without suffering reliability problems due to high-voltage gate-oxide damage. Further, in operation the comparator circuit consumes no static current and may only experience current leakage.

FIG. 1 illustrates a circuit diagram of a single-ended comparator circuit 100 configured in accordance with one aspect of the disclosed approach that includes a voltage limiting circuit 110 coupled to an input node IN, a single-ended voltage detection circuit 140 coupled to the voltage limiting circuit 110 at a node A, and an output buffer circuit 160 coupled to the single-ended voltage detection circuit 140 at a node B. The output buffer circuit 160 provides an output of the single-ended comparator circuit 100 at an output node OUT. In one aspect of the disclosed approach, the single-ended comparator circuit 100 provides an interface between logic that is coupled to the output node OUT, where the logic (not shown to avoid unnecessarily complicating the figure) may be located on the same die as the single-ended comparator circuit 100, and a device (not shown in FIG. 1), which may be external to the die, that is coupled to the input node IN. For example, where the device is a device implementing an interface conforming to the previously noted USB standards as promulgated by the USB Working Group, the input node IN of the single-ended comparator circuit 100 may be used for signal lines referenced in the standards as D+ and D− signal lines. Preferably, a respective single-ended comparator circuit 100 would be used to interface the logic with each of the D+ or the D− signal lines.

In the voltage limiting circuit 110, a transistor M1 112, which in one aspect of the disclosed approach is an N-type metal-oxide-semiconductor (NMOS) transistor, is powered at 1.8V and its gate is connected to the input node IN. A second transistor M2 114, which in one aspect of the disclosed approach is an NMOS transistor, is used for the purpose of providing a voltage limiting feature. A gate of the transistor M2 114 is tied to 1.8V, and its drain and source are connected to the input IN and a source of the transistor M1 112, respectively. For input voltage levels less than 1.8V, the transistor M2 114 is on and the source of the transistor M2 114 follows the input signal until M2 source reaches to approximately 1.8V−Vtn2, where Vtn2 is the threshold voltage of the transistor M2 114. For an input voltage level larger than 1.8V, the transistor M1 112 starts to turn on and will enhance the source of the transistor M2 114 to 1.8V. Without the presence of the transistor M1 112, for certain process corners and operating conditions a maximum source voltage of the transistor M2 114 might not be large enough to trigger a low-to-high transition in the subsequent comparator of the voltage detection circuit 140. However, the addition of the transistor M1 112 into the voltage limiting circuit 110 enhances the output voltage of the voltage limiting circuit 110 to the power rail and solves this problem. The maximal Vgs and Vgd of the transistor M1 112 and the transistor M2 114 are 1.8V, and therefore no gate-oxide overvoltage stress should be present. Further, after the voltage limiting circuit 110, all voltage levels are within a range of 0-1.8V, so no high-voltage gate-oxide reliability issues should be experienced in the single-ended comparator circuit 100.

For the single-ended voltage detection circuit 140, its output at a node B is zero if the input at the input node IN is lower than 0.8V and its output at the node B is 1.8V if the input at the input node IN is larger than 2V. In the single-ended voltage detection circuit 140 as shown in FIG. 1, a transistor M3 142 and a transistor M4 144 form a detector subcircuit with inverted output polarity. In one aspect of the disclosed approach, the transistor M3 142 and the transistor M4 144 are sized such that a switching threshold voltage meets a specified requirement, such as for the USB standard as referenced above. A transistor M7 150 and a transistor M8 152 invert an output polarity of the detector subcircuit while a transistor M5 146 and a transistor M6 148, where the transistor M6 148 is configured as a diode, form a hysteresis subcircuit to provide hysteresis so as to reduce noise sensitivity of the comparator circuit. In one aspect of the disclosed approach, the transistors M3 142 and M7 150 are P-type metal-oxide-semiconductor (PMOS) transistors, while the transistors M4 144, M5 146, M6 148 and M8 152 are NMOS transistors.

In FIG. 1, for a low input signal at the input node IN of 0V, the voltage at the gates of the transistor M3 142 and the transistor M4 144 is also at 0V while the voltage at the gates of the transistor M7 150 and the transistor M8 152 is at 1.8V.

An operation of a hysteresis subcircuit including the transistor M5 146 and the transistor M6 148 may be described as follows. The voltage at the gate of the transistor M5 146 is at 0V (i.e., the transistor M5 146 is off). At the start of a low-to-high transition at the input node IN, because the transistor M5 146 is off initially, the source of the transistor M4 144 starts at Vgs6 above ground. This causes the transistor M3 142 and the transistor M4 144 of the detector subcircuit to have a larger threshold voltage compared with the case when the source of the transistor M4 144 is at 0V. After the gate voltages of the transistor M3 142 and the transistor M4 144 reach their threshold voltage, the gates of the transistor M7 150 and the transistor M8 152 are flipped to 0V, which will turn on the transistor M5 146. Once the transistor M5 146 is turned on, the source voltage of the transistor M4 144 is pulled to 0V. At the beginning of a high-to-low transition, since the source voltage of the transistor M4 144 is at 0V, the switching threshold of the transistor M3 142 and the transistor M4 144 detector circuit is not affected by the transistor M6. As a result, the threshold voltage is smaller compared with the low-to-high transition case. Consequently, hysteresis is introduced to the single-ended voltage detection circuit 140. Typically, the hysteresis is around 200 mV in this process.

A signal at an output node OUT is obtained by buffering the output from the single-ended voltage detection circuit 140 with the use of the output buffer circuit 160. In one aspect of the disclosed approach, the output buffer circuit 160 includes two serially connected inverters 162 and 164. In other implementations, other circuits may be used to provide the functions provided by the two serially connected inverters 162 and 164.

Figure 2:
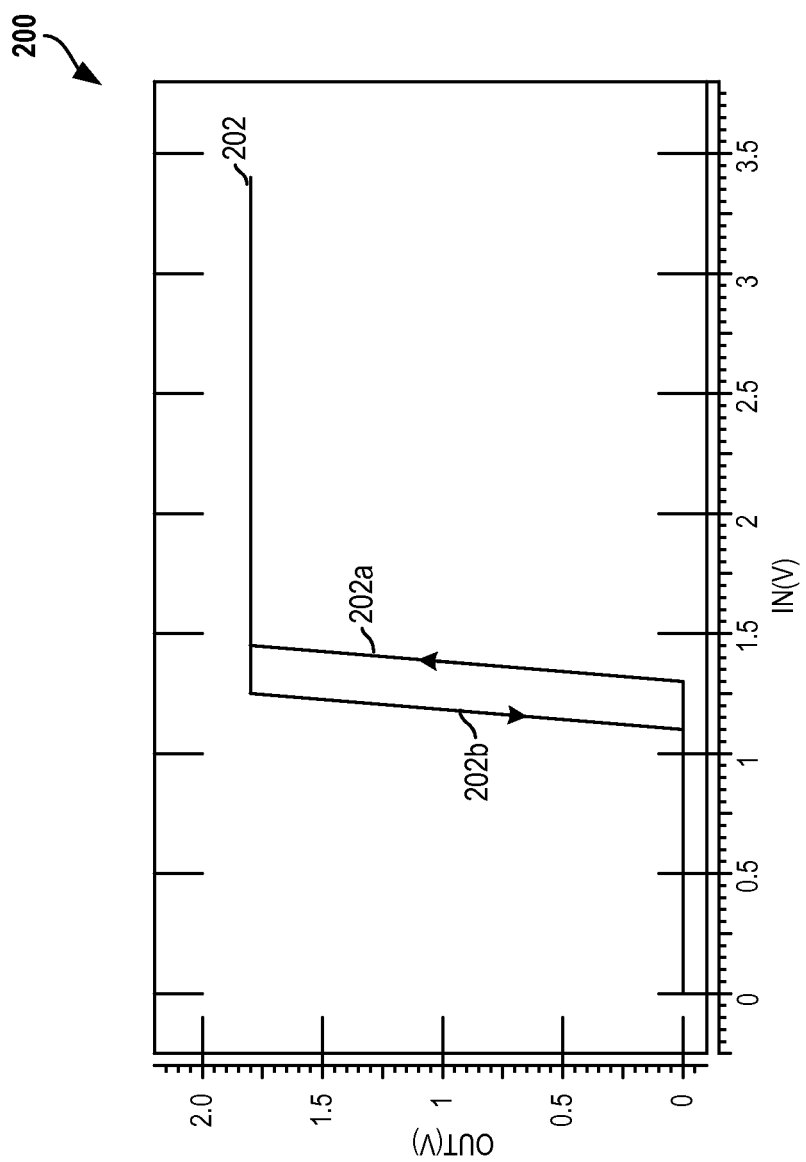
FIG. 2 is a plot of a direct current (DC) simulation waveform providing input-output characteristics of the comparator circuit of FIG. 1.

FIG. 2 illustrates a plot 200 of a DC simulation waveform 202 illustrating the input-output characteristics of the single-ended comparator circuit 100 of FIG. 1, where the hysteresis feature of the single-ended comparator circuit 100 is illustrated by two portions 202a,b. The portion 202a illustrates the behavior of the single-ended comparator circuit 100 when the voltage change at the node IN in a rising edge situation, while the portion 202b illustrates the behavior of the single-ended comparator circuit 100 when the voltage change at the node IN in a falling edge situation.

Figure 3:
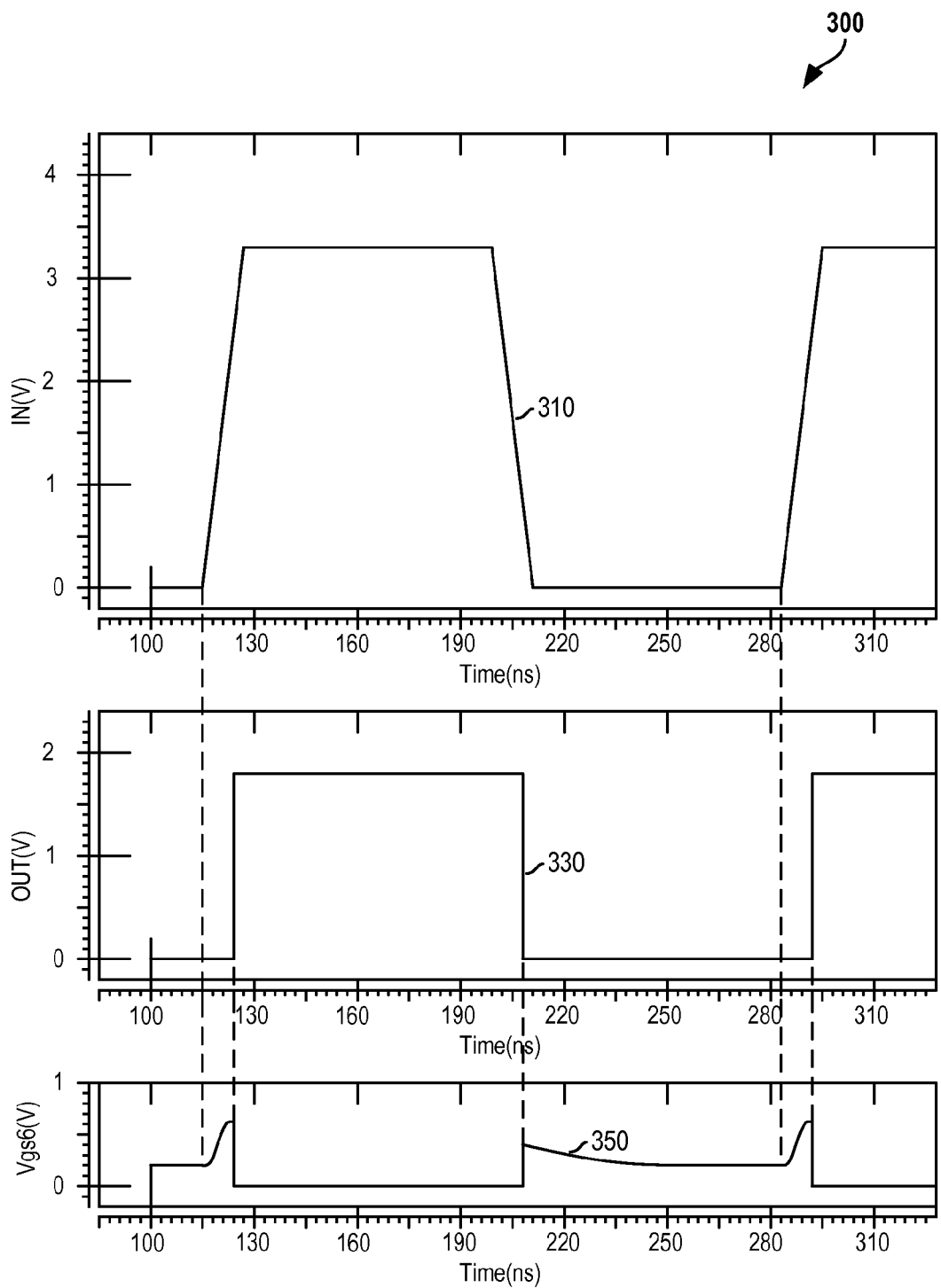
FIG. 3 is a plot of various transient simulation waveforms of the comparator circuit of FIG. 1.

FIG. 3 illustrates a plot 300 of transient simulation waveforms 310, 330, and 350, of IN, OUT and $V_{gs6}$ (i.e., the gate-to-source voltage of the transistor M6 148), respectively, in the single-ended comparator circuit 110 shown in FIG. 1. Further, the following tables illustrate the voltage at a node A in FIG. 1 under two conditions, where Table 1 describes the voltage at the node A when the voltage change at the node IN is in a rising edge situation, and Table 2 describes the voltage at the node A when the voltage change at the node IN is in a falling edge situation.

TABLE 1

Rising Edge

| Range | Voltage at Node IN | Voltage at Node A |
|---|---|---|
| 1 | ground to (1.8 v – Vthn) | ground to (1.8 – Vthn) |
| 2 | 1.8 v to 3.3 v | (1.8 – Vthn) to 1.8 [actively held] |
| 3 | (1.8 v – Vthn) to 1.8 v | (1.8 – Vthn) [floating] |

TABLE 2

Falling Edge

| Range | Voltage at Node IN | Voltage at Node A |
|---|---|---|
| 1' | (1.8 + Vthn) to (1.8 v – Vthn)] | 1.8 v [floating] |
| 2' | 3.3 v to 1.8 + Vthn | 1.8 v [actively held] |
| 3' | (1.8 v – Vthn) to ground | 1.8 v to ground |

In the rising edge situation, the transistor M2 114 couples the input node IN to the node A, which is the input for circuit 200, for voltages at the node IN within range 1 (i.e., from ground to [1.8 v–Vthn]). In one aspect of the disclosed approach, the switching point of circuit 200 is configured to be within the first range. In range 3, where the voltage at the input node IN ranges from [1.8 v–Vthn] to [1.8 v], neither the transistor M1 112 nor the transistor M2 114 is conducting, the voltage at the node A is not at its full extent and may be considered to be in a transitional range. In range 3, neither the transistor M1 112 nor the transistor M2 114 is "in control", and the voltage at the node A is left in a "floating" state. In one aspect of the disclosed approach, the floating state is below the 1.8 v rail (i.e., not fully switched). For range 2, the transistor M1 112 couples the node A to the power supply rail when the voltage at the input node IN is between 1.8 v to 3.3 v to eliminate the floating condition of the node A. Thus, the transistor M1 112 brings and maintains the voltage at the node A at a 1.8 v rail, thereby removing static current draw. The falling edge case operates in a reverse fashion after accounting for the transistor threshold voltage.

Further, in the examples provided herein, an example power supply voltage is 1.8 v, and the device threshold voltage at a gate input for the transistors described herein is approximately 0.6 v, below which the device does not conduct current. Further, the device threshold voltage of an N-type semiconductor device may be referred to as Vthn, and may be referred to as Vthp for a P-type semiconductor device.

As used herein, the terms low-voltage and high-voltage should not be construed as limiting in so far as they are relative terms and may be applicable to any situation where a semiconductor device has a first particular maximum voltage level (i.e., the "low-voltage") at which it designed to operate without suffering damage that is lower than a second voltage level (i.e., the "high-voltage") expected to be received at an input for the semiconductor device. In other words, a high-voltage may be understood to be a voltage level above an operating range of the semiconductor device, where the operating range refers to a range of voltages that the semiconductor device may be used without suffering damage such as gate-oxide damage, with the low-voltage being the maximum voltage of the operating range.

Figure 4:
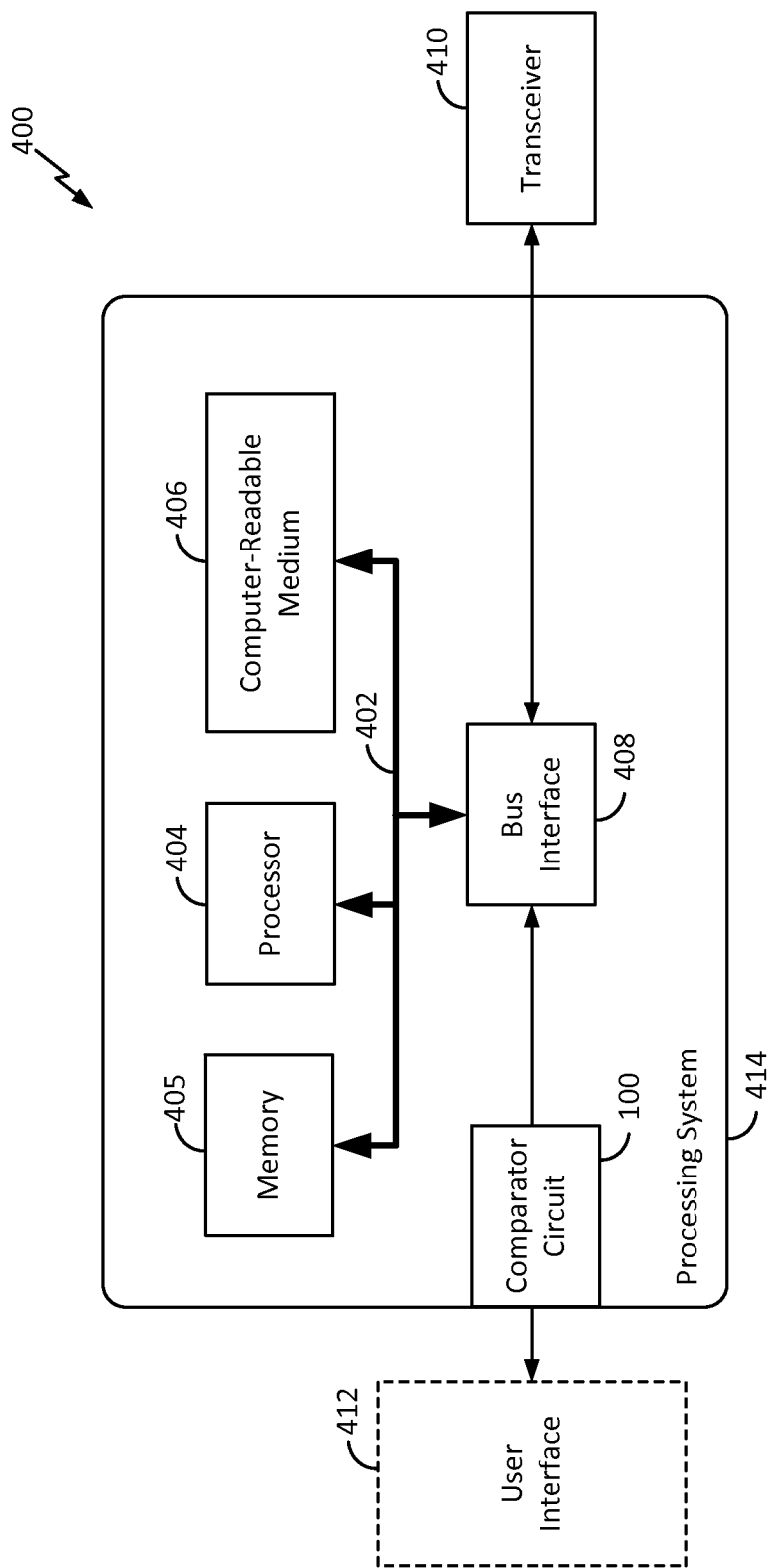
FIG. 4 is a block diagram illustrating an example of a hardware implementation of an apparatus employing a processing system in which the comparator circuit of FIG. 1 may be used.

FIG. 4 is a conceptual diagram illustrating an example of a hardware implementation for an apparatus 400 employing a processing system 414 that may be implemented having the comparator circuit 100 to receive an input signal with information at a voltage level higher than the voltage level normally supported by the semiconductor devices used to create the comparator circuit. In accordance with various aspects of the disclosure, the comparator circuit, or any combination of the comparator circuits may be implemented as part of a processing system 414 that includes one or more processors 404. Examples of processors 404 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure.

In this example, the processing system 414 may be implemented with a bus architecture, represented generally by the bus 402. The bus 402 may include any number of interconnecting buses and bridges depending on the specific application of the processing system 414 and the overall design constraints. The bus 402 links together various circuits including one or more processors (represented generally by the processor 404), a memory 405, and computer-readable media (represented generally by the computer-readable medium 406). The bus 402 may also link various other circuits such as timing sources, peripherals, voltage regulators, and power management circuits, which are well known in the art, and therefore, will not be described any further. A bus interface 408 provides an interface between the bus 402 and a transceiver 410. The transceiver 410 provides a means for communicating with various other apparatus over a transmission medium.

Depending upon the nature of the apparatus, a user interface 412 (e.g., keypad, display, speaker, microphone, joystick) may also be provided. For example, any of the aforementioned devices that may be included in the user interface 412 may be a device conforming to a serial bus specification more commonly known as Universal Serial Bus (USB). The USB specification specifies hardware as well as electrical interfaces, where the electrical interface includes differential transmission pair for data. The differential levels between the two nodes may range from a voltage level as small as 0.3V to greater than 3.6V. These voltage levels may significantly exceed the voltage levels for which the rest of the circuit used to implement the rest of the processing system 414. In one aspect of the disclosed approach, the comparator circuit 100 may be used to receive the USB input and provide an output at a voltage level that may be more compatible with the rest of the circuits in the processing circuit 414.

The processor 404 is responsible for managing the bus 402 and general processing, including the execution of software stored on the computer-readable medium 406. The software, when executed by the processor 404, causes the processing system 414 to perform the various functions described infra for any particular apparatus. The computer-readable medium 406 may also be used for storing data that is manipulated by the processor 404 when executing software.

One or more processors 404 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 406. The computer-readable medium 406 may be a non-transitory computer-readable medium such as a computer-readable storage medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 406 may reside in the processing system 414, external to the processing system 414, or distributed across multiple entities including the processing system 414. The computer-readable medium 406 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

Figure 5:
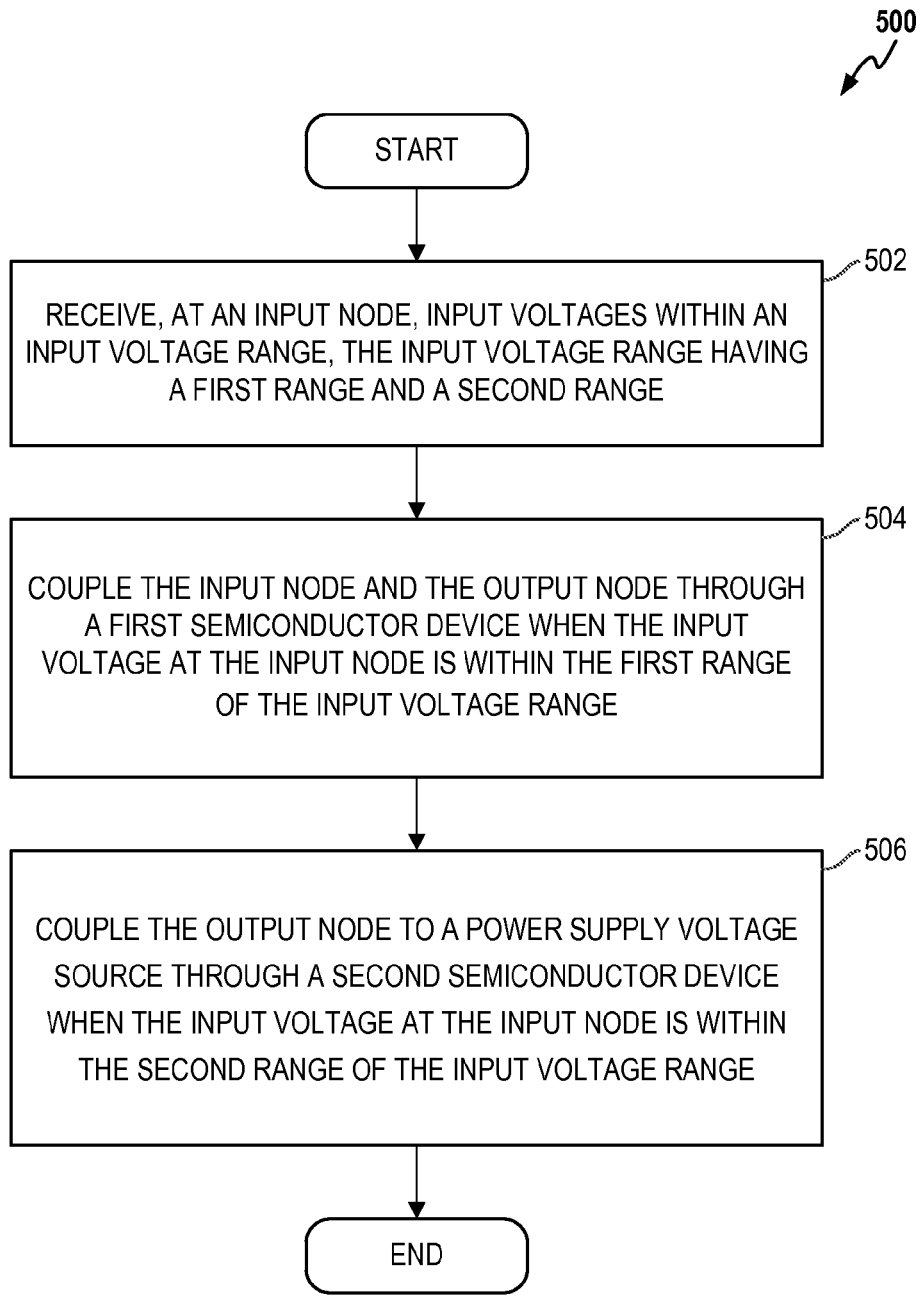
FIG. 5 is a flow diagram illustrating an operation for a single-ended comparator circuit configured in accordance with one aspect of the disclosed approach.

FIG. 5 illustrates a comparator process 500 for a single-ended high-voltage input-capable comparator circuit such as the single-ended comparator circuit 100 of FIG. 1. Input voltages with an associated voltage range having a first range and a second range may be received at an input node at 502. An output node may be coupled to the input node through a first semiconductor device when the input voltage at the input node is within the first range of the input voltage range at 504. Thus, for example, if the first range of the input voltage range is within a tolerable range as discussed above, such as from 0 to approximately 1.8V, the output node may reflect the signal received at the input node. The output node may be coupled to a power supply voltage source through a second semiconductor device when the input voltage at the input node is within the second range of the input voltage range at 506. Thus, for example, if the input node is within the second range of the input voltage range, which may be from above the approximately 1.8V of the first voltage range and higher, then the output node may be coupled to the power supply voltage source that, by design, has the highest suitable voltage for any downstream circuits coupled to the comparator circuit.

Several aspects of a single-ended high-voltage input-capable comparator circuit have been presented. As those skilled in the art will readily appreciate, various aspects described throughout this disclosure may be extended to other comparator methods, apparatus, and systems.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

One or more of the components, steps, features and/or functions illustrated in the FIGS. may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGS. may be configured to perform one or more of the methods, features, or steps described in the FIGS. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:
1. An apparatus, comprising:
   an input node configured to receive input voltages within an input voltage range, the input voltage range comprising a first range and a second range;
   a voltage-limited output node;
   a first semiconductor device configured to couple the input node and the voltage-limited output node when an input voltage at the input node is within the first range of the input voltage range;
   a second semiconductor device configured to couple the voltage-limited output node to a power supply voltage source comprising a power supply voltage level when the input voltage at the input node is within the second range of the input voltage range, wherein the input voltage range is greater than an operating range of either the first or second semiconductor device, and wherein a maximum voltage of the input voltage range is greater than the power supply voltage level; and a single-ended voltage detection circuit coupled to the voltage-limited output node, wherein the single-ended voltage detection circuit comprises hysteresis generation circuitry.

2. The apparatus of claim 1, wherein the input voltage range comprises a third range between the first range and the second range, and wherein neither the first nor second semiconductor device controls the voltage-limited output node when the input voltage at the input node is within the third range.

3. The apparatus of claim 1, wherein the first and second semiconductor devices comprise a metal-oxide-semiconductor transistor.

4. The apparatus of claim 1, wherein a maximum voltage of the operating range of the first and second semiconductor devices is approximately 1.8V.

5. The apparatus of claim 1, wherein the hysteresis generation circuitry comprises a diode-connected transistor and a switching transistor.

6. The apparatus of claim 1, wherein the apparatus consumes no static current other than leakage current.

7. An apparatus, comprising:
an input node configured to receive input voltages within an input voltage range, the input voltage range comprising a first range and a second range;
a voltage-limited output node;
a first semiconductor means configured to couple the input node and the voltage-limited output node when an input voltage at the input node is within the first range of the input voltage range;
a second semiconductor means configured to couple the voltage-limited output node to a power supply voltage source comprising a power supply voltage level when the input voltage at the input node is within the second range of the input voltage range,
wherein the input voltage range is greater than an operating range of either the first or second semiconductor means, and wherein a maximum voltage of the input voltage range is greater than the power supply voltage level; and
a single-ended voltage detection means coupled to the voltage-limited output node, wherein the single-ended voltage detection means comprises hysteresis generation means.

8. The apparatus of claim 7, wherein the input voltage range comprises a third range between the first range and the second range, and wherein neither the first nor second semiconductor means controls the voltage-limited output node when the input voltage at the input node is within the third range.

9. The apparatus of claim 7, wherein the first and second semiconductor means comprise a metal-oxide-semiconductor transistor.

10. The apparatus of claim 7, wherein a maximum voltage of the operating range of the first and second semiconductor means is approximately 1.8V.

11. The apparatus of claim 7, wherein the hysteresis generation means comprises a diode-connected transistor and a switching transistor.

12. The apparatus of claim 7, wherein the apparatus consumes no static current other than leakage current.

13. A method for coupling information received at an input node and an output node, comprising:

receiving input voltages within an input voltage range, the input voltage range comprising a first range and a second range;
coupling the input node and the output node through a first semiconductor device when the input voltage at the input node is within the first range of the input voltage range;
coupling the output node to a power supply voltage source through a second semiconductor device when the input voltage at the input node is within the second range of the input voltage range, wherein the power supply voltage source comprises a power supply voltage level,
wherein the input voltage range is greater than an operating range of either the first or second semiconductor device, and wherein a maximum voltage of the input voltage range is greater than the power supply voltage level;
receiving a voltage limited signal based on an input signal at the output node;
performing single-ended voltage level detection on the voltage limited signal; and
generating a detected output based on the single-ended voltage level detection, wherein the generating the detected output comprises performing hysteresis before generating the detected output.

14. The method of claim 13, wherein the first and second semiconductor devices comprise a metal-oxide-semiconductor transistor.

15. The method of claim 13, wherein a maximum voltage of the operating range of the first and second semiconductor devices is approximately 1.8V.

16. The method of claim 13, further comprising minimizing static current consumption other than leakage current.

17. An apparatus for wireless communication, comprising:
at least one processor; and
an input circuit coupled to the at least one processor comprising:
an input node configured to receive input voltages conveying information to be used by the at least one processor, wherein the input voltages are within an input voltage range and the input voltage range comprising a first range and a second range;
a voltage-limited output node;
a first semiconductor device configured to couple the input node and the voltage-limited output node when an input voltage at the input node is within the first range of the input voltage range;
a second semiconductor device configured to couple the voltage-limited output node to a power supply voltage source comprising a power supply voltage level when the input voltage at the input node is within the second range of the input voltage range,
wherein the input voltage range is greater than an operating range of either the first or second semiconductor device, and wherein a maximum voltage of the input voltage range is greater than the power supply voltage level; and
a single-ended voltage detection circuit coupled to the voltage-limited output node, wherein the single-ended voltage detection circuit comprises hysteresis generation circuitry.

18. The apparatus of claim 17, wherein the input voltage range comprises a third range between the first range and the second range, and wherein neither the first nor second semiconductor device controls the voltage-limited output node when the input voltage at the input node is within the third range.

19. The apparatus of claim 17, wherein the first and second semiconductor devices comprise a metal-oxide-semiconductor transistor.

20. The apparatus of claim 17, wherein a maximum voltage of the operating range of the first and second semiconductor devices is approximately 1.8V.

21. The apparatus of claim 17, wherein the hysteresis generation circuitry comprises a diode-connected transistor and a switching transistor.

* * * * *